United States Patent
Cho et al.

(10) Patent No.: US 8,461,933 B2
(45) Date of Patent: Jun. 11, 2013

(54) DEVICE AND METHOD FOR FREQUENCY CALIBRATION AND PHASE-LOCKED LOOP USING THE SAME

(75) Inventors: Yi-Hsien Cho, Hsinchu County (TW); Yu-Li Hsueh, New Taipei (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 35 days.

(21) Appl. No.: 13/070,425

(22) Filed: Mar. 23, 2011

(65) Prior Publication Data
US 2012/0098603 A1 Apr. 26, 2012

Related U.S. Application Data

(60) Provisional application No. 61/406,779, filed on Oct. 26, 2010.

(51) Int. Cl.
*H03L 7/08* (2006.01)
*H03L 7/18* (2006.01)

(52) U.S. Cl.
USPC .............. 331/17; 327/115; 327/156; 331/1 A; 375/376

(58) Field of Classification Search
USPC ................ 327/115, 147, 156; 331/16, 17, 34, 331/177 R, 1 A; 375/373, 376
See application file for complete search history.

(56) References Cited

U.S. PATENT DOCUMENTS

| | | | | |
|---|---|---|---|---|
| 3,753,142 A | * | 8/1973 | Nardin et al. ................. | 331/1 A |
| 3,840,822 A | * | 10/1974 | Hoffmann ........................ | 331/16 |
| 4,143,328 A | * | 3/1979 | Kurita et al. .................. | 327/159 |
| 4,310,805 A | * | 1/1982 | Hackert et al. ................. | 331/1 A |
| 4,667,169 A | * | 5/1987 | Matsuura et al. ............... | 331/14 |
| 4,841,255 A | * | 6/1989 | Ohba et al. ..................... | 331/14 |
| 5,008,629 A | * | 4/1991 | Ohba et al. .................... | 327/107 |
| 6,002,278 A | * | 12/1999 | Saito ............................. | 327/115 |
| 6,329,855 B1 | * | 12/2001 | Horie ............................ | 327/159 |
| 6,583,674 B2 | * | 6/2003 | Melava et al. .................. | 331/16 |
| 7,590,387 B2 | | 9/2009 | Chien | |
| 2001/0022537 A1 | | 9/2001 | Melava | |
| 2005/0012555 A1 | | 1/2005 | Nord | |

FOREIGN PATENT DOCUMENTS
CN    1893278 A    1/2007

* cited by examiner

*Primary Examiner* — Levi Gannon
(74) *Attorney, Agent, or Firm* — Winston Hsu; Scott Margo

(57) ABSTRACT

The frequency calibration device includes a logic unit for gating the clock signal according to a gating window signal to generate a gated clock signal, and a divider for dividing the gated clock signal by a divisor in frequency to generate a frequency indication signal, and output digits of the divider are set to the divisor in a calibration cycle, and the frequency indication signal is a most significant bit of the output digits.

25 Claims, 12 Drawing Sheets

| Counting result | Output digits | Oscillating frequency |
|---|---|---|
| N+6 : | 1 1 1 0 1 0 | $(N+4.5)/W < f < (N+6.5)/W$ |
| N+5 : | 1 1 1 0 1 1 | $(N+3.5)/W < f < (N+5.5)/W$ |
| N+4 : | 1 1 1 1 0 0 | $(N+2.5)/W < f < (N+4.5)/W$ |
| N+3 : | 1 1 1 1 0 1 | $(N+1.5)/W < f < (N+3.5)/W$ |
| N+2 : | 1 1 1 1 1 0 | $(N+0.5)/W < f < (N+2.5)/W$ |
| N+1 : | 1 1 1 1 1 1 | $(N-0.5)/W < f < (N+1.5)/W$ |
| N   : | 0 0 0 0 0 0 | $(N-1.5)/W < f < (N+0.5)/W$ |
| N−1 : | 0 0 0 0 0 1 | $(N-2.5)/W < f < (N-0.5)/W$ |
| N−2 : | 0 0 0 0 1 0 | $(N-3.5)/W < f < (N-1.5)/W$ |
| N−3 : | 0 0 0 0 1 1 | $(N-4.5)/W < f < (N-2.5)/W$ |
| N−4 : | 0 0 0 1 0 0 | $(N-5.5)/W < f < (N-3.5)/W$ |
| N−5 : | 0 0 0 1 0 1 | $(N-6.5)/W < f < (N-4.5)/W$ |

FIND (MSB)      Last digits

FIG. 5A

DEVICE AND METHOD FOR FREQUENCY CALIBRATION AND PHASE-LOCKED LOOP USING THE SAME

CROSS REFERENCE TO RELATED APPLICATIONS

This application claims the benefit of U.S. Provisional Application No. 61/406,779, filed on 2010 Oct. 26 and entitled "VCO Frequency Calibration", the contents of which are incorporated herein by reference.

BACKGROUND OF THE INVENTION

1. Field of the Invention

The present invention is related to devices and a method for frequency calibration, and more particularly, to devices and a method adjusting an oscillating frequency of a clock signal through dividing and gating the clock signal.

2. Description of the Prior Art

With advances in communication technology, wireless communication devices, such as a mobile phone, personal digital assistant (PDA), etc., are frequently used in modern society. These communication devices generally include a voltage-controlled oscillator (VCO) for providing a variable clock frequency to implement various communication algorithms. To generate a desired oscillating frequency, high accurate frequency calibration is required, but takes a long counting time to compute an adjustment margin for the oscillating frequency.

However, the typical high frequency counter has to be implemented in an analog circuit, which requires additional circuit layout area. Thus, economically calibrating the clock frequency of the VCO has been a major focus of the industry.

SUMMARY OF THE INVENTION

It is therefore an objective of the claimed invention to provide a frequency calibration device, a frequency calibration method, a phase-locked loop and a device using the same.

An embodiment of the present invention discloses a frequency calibration device for calibrating an oscillating frequency of a clock signal. The frequency calibration device comprises a logic unit for gating the clock signal according to a gating window signal to generate a gated clock signal, and a divider for dividing the gated clock signal by a divisor in frequency to generate a frequency indication signal, wherein a plurality of output digits of the divider are set to the divisor in a calibration cycle, wherein the frequency indication signal is a most significant bit (MSB) of the plurality of output digits.

An embodiment of the present invention further discloses a frequency calibration method for calibrating an oscillating frequency of a clock signal. The frequency calibration method comprises setting a plurality of output digits of a divider to a divisor in a calibration cycle, gating the clock signal according to a gating window signal to generate a gated clock signal, dividing the gated clock signal by the divisor in frequency to generate a frequency indication signal, and adjusting the oscillating frequency according to frequency indication signal, wherein the frequency indication signal is a most significant bit (MSB) of the plurality of output digits.

An embodiment of the present invention further discloses a phase-locked loop (PLL) comprising a detector for generating a tuning voltage according to a frequency reference signal and a frequency indication signal, a voltage-controlled oscillator (VCO) for generating a clock signal according to the tuning voltage, wherein a frequency of the clock signal is adjustable, and a feedback loop coupled between an output of the VCO and an input of the detector, the feedback loop comprising a logic unit for gating the clock signal to generate a gated clock signal with a gating window, a divider for dividing the gated clock signal by a divisor in frequency to generate the frequency indication signal, and a control circuit for adjusting an oscillating frequency of the clock signal according to a static logic level of the frequency indication signal.

An embodiment of the present invention further discloses a device for calibrating an oscillating frequency of a clock signal. The device comprises means for gating the clock signal to generate a gated clock signal with a gating window, means for dividing the gated clock signal by a divisor in frequency to generate a frequency indication signal, and means for adjusting the oscillating frequency of the clock signal according to a static logic level of the frequency indication signal.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5A is a look-up table of a counting result, output digits and an oscillating frequency of the divider of the PLLs shown in FIG. 1A, FIG. 1B, FIG. 3A and FIG. 3B.

DETAILED DESCRIPTION

Figure 1A:
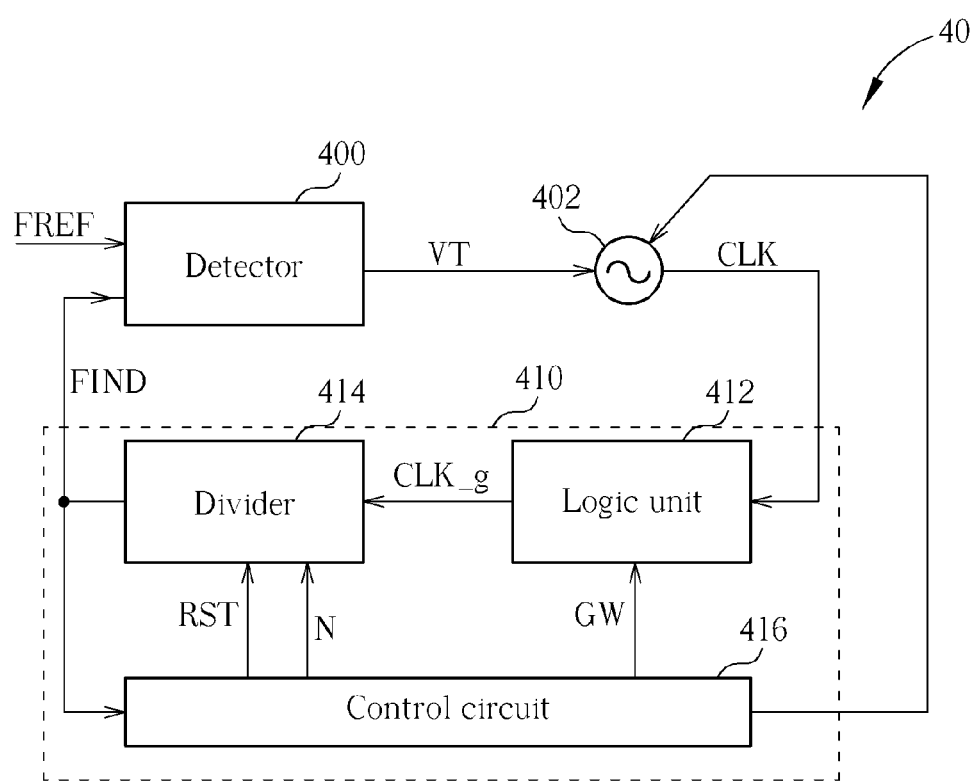
FIG. 1A is a schematic diagram of a PLL according to an embodiment of the present invention.

FIG. 1A is a schematic diagram of a phase-locked loop (PLL) 40 according to an embodiment of the present invention. The PLL 40 includes a detector 400, a voltage-controlled oscillator (VCO) 402 and a feedback loop 410. The detector 400 is utilized for generating a tuning voltage VT according to a frequency reference signal FREF and a frequency indication signal FIND. The VCO 402 is utilized for generating a clock signal CLK with an adjustable frequency according to the tuning voltage VT. The feedback loop 410 includes a logic unit 412, a divider 414 and a control circuit 416. The logic unit 412 is utilized for gating the clock signal CLK according to a gating window signal GW indicative of a gating window to generate a gated clock signal CLK_g with the gating window. The divider 414 is utilized for dividing the gated clock signal CLK_g by a divisor N in frequency to generate the frequency indication signal FIND. Finally, the control circuit 416 adjusts an oscillating frequency of the clock signal CLK according to a static logic level of the frequency indication signal FIND.

In short, to economically calibrate the oscillating frequency of the VCO, the divider 414 is further arranged to function as a counter to determine whether the oscillating frequency conforms to a target frequency and accordingly indicate to step up or step down the oscillating frequency. Since the divider 414 is a common component of the feedback loop 410, such a calibration method does not increase circuit layout area.

Figure 1B:
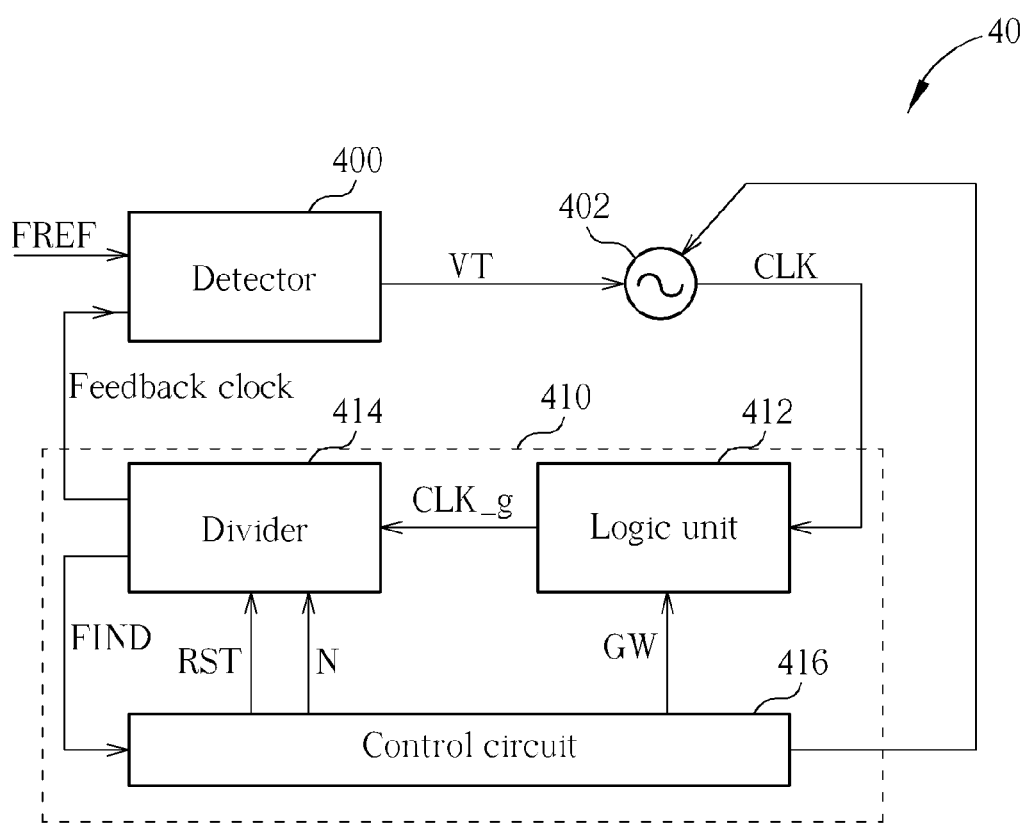
FIG. 1B is a schematic diagram of an alternative embodiment of the PLL shown in FIG. 1A.

Certainly, the PLL 40 can be arranged to provide the clock signal CLK without the calibration process (i.e. in the normal mode). In the presented calibration mode, the tuning voltage VT is first held to fix the oscillating frequency, and the frequency indication signal FIND is a static logic level indicating whether the oscillating frequency conforms to the target frequency. Alternatively, the divider 414 separately provides the frequency indication signal FIND to the control circuit 416 and the feedback clock to the detector 400, as illustrated in FIG. 1B.

Figure 2A:
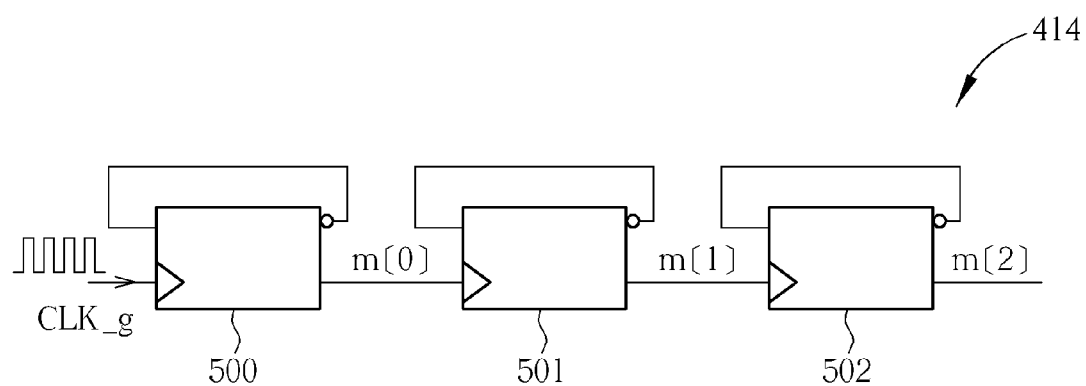
FIG. 2A is a schematic diagram of a divider of the PLLs shown in FIG. 1A and FIG. 1B.
Figure 2B:
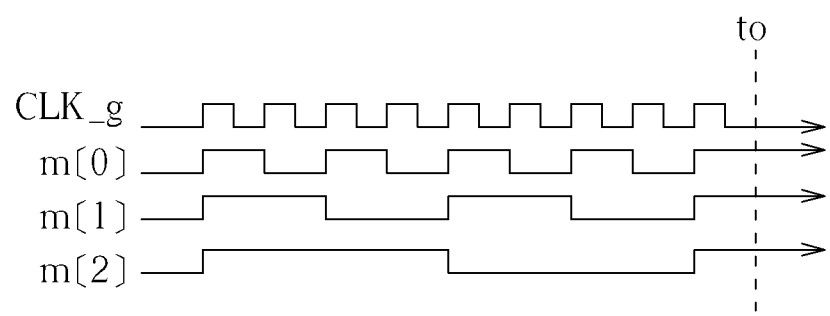
FIG. 2B and FIG. 2C are timing diagrams of signals of the divider shown in FIG. 2A.
Figure 2C:
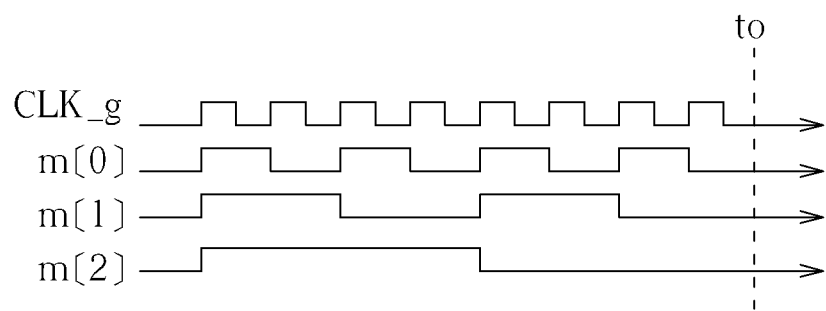

In detail, please refer to FIG. 2A, FIG. 2B and FIG. 2C. FIG. 2A is a simplified schematic diagram of the divider 414. FIG. 2B and FIG. 2C are timing diagrams of signals of the divider 414, illustrating how the divider 414 functions as a counter. In FIG. 2A, the divider 414 includes three stages (D flip-flops 500, 501, 502 respectively), which are arranged to divide the gated clock signal CLK_g by two in frequency per stage. As long as output digits m[0], m[1], m[2] are set to a divisor N(e.g., eight for example used in FIG. 2B and FIG. 2C) by a reset signal RST from the control circuit 416, a most significant bit (MSB) m[2] of the output digits m[0], m[1], m[2] indicates whether more than eight (i.e., the divisor) cycles of the gated clock signal CLK_g are counted in. If more than eight cycles of the gated clock signal CLK_g are counted in, the MSB m[2] is enabled at a time t1(FIG. 2B). On the contrary, If less than eight cycles of the gated clock signal CLK_g are counted in, the MSB m[2] is disabled at the time t1(FIG. 2C). That is, through setting the output digits to a desired divisor N in a calibration cycle, the divider 414 can function as a counter to determine whether the oscillating frequency conforms to a target frequency directly proportional to the divisor N. It is noted that FIG. 2A is only an example for illustrating purpose, the actual circuits can be implemented by various programmable dividers, including PS counters and multi-modulus dividers.

Figure 3A:
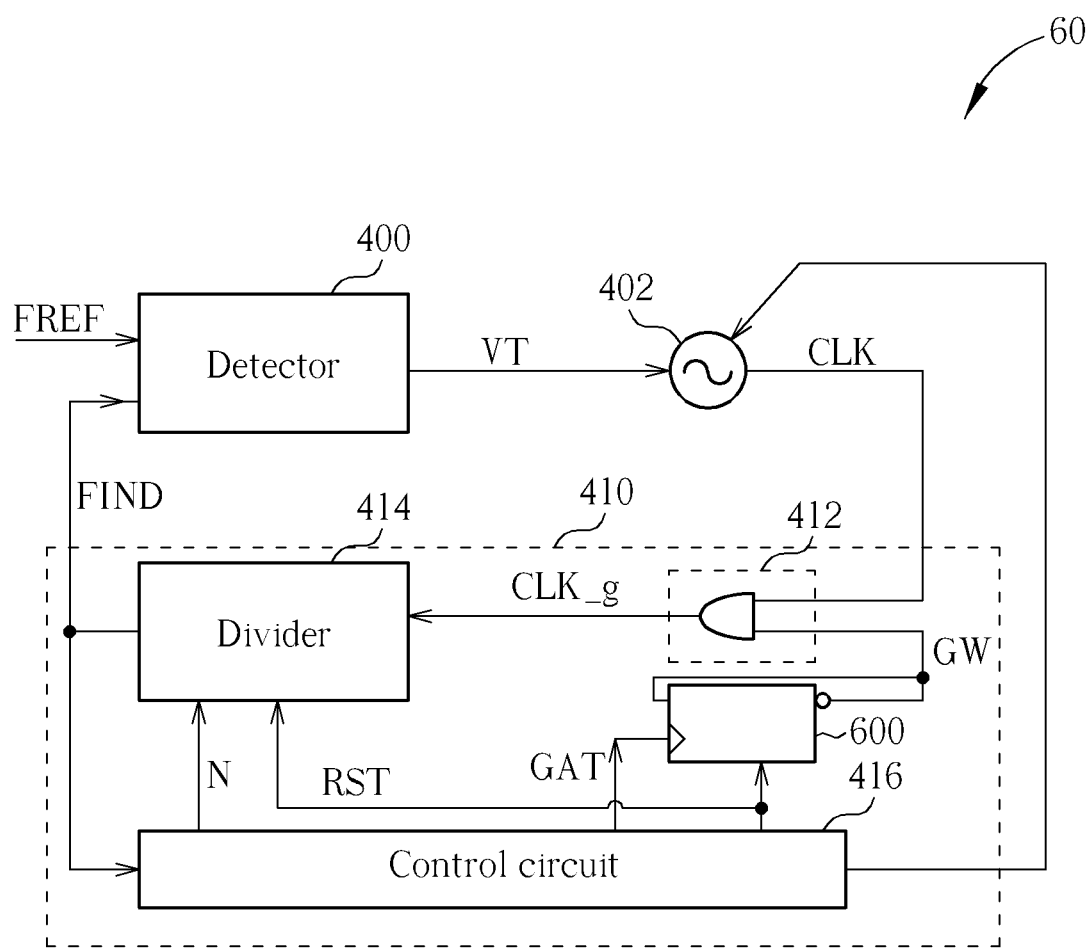
FIG. 3A and FIG. 3B are a schematic diagram of alternative embodiments of the PLLs shown in FIG. 1A and FIG. 1B.
Figure 3B:
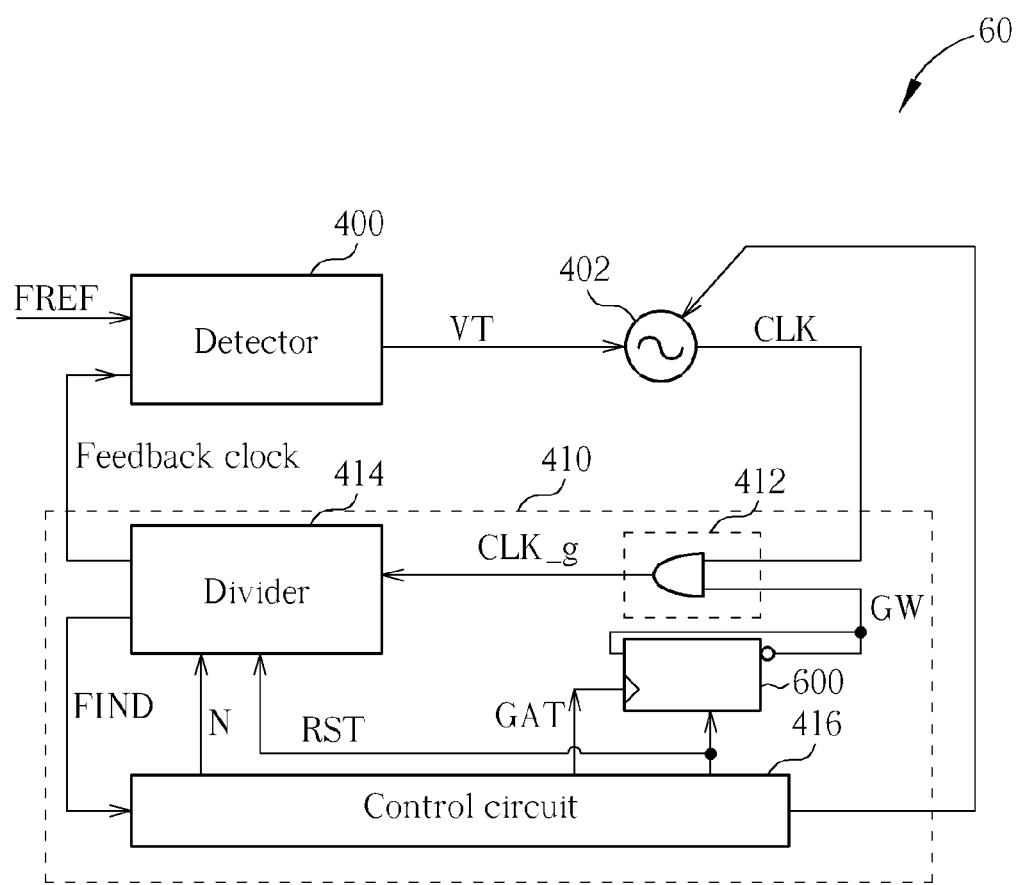
Figure 4:
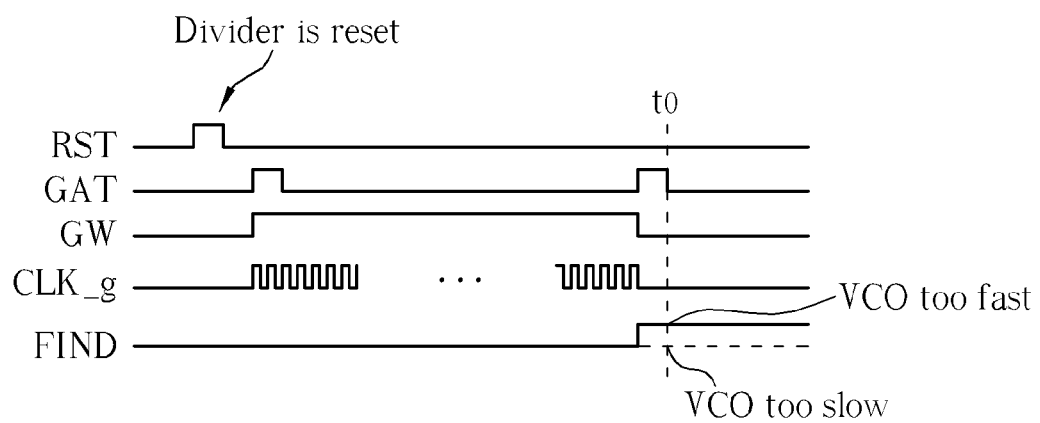
FIG. 4 is a timing diagram of signals of the PLLs shown in FIG. 3A and FIG. 3B.

In addition, to provide a gating window signal GW according to a gating signal GAT, a PLL 60 can further include a D flip-flop 600 in comparison with the PLL 40, as illustrated in FIG. 3A and FIG. 3B. The logic unit 412, an AND gate in this example, gates the gating window signal GW and the clock signal CLK to generate the gated clock signal CLK_g. Please continue to refer to FIG. 4, which is a timing diagram of the reset signal RST, the gating signal GAT, the gating window signal GW, the gated clock signal CLK_g and the frequency indication signal FIND. In FIG. 4, the divider 414 is set to a target value based on the desired divisor N prior to the gated clock signal CLK_g to correctly determine the oscillating frequency. Note that, the frequency indication signal FIND is checked after the gated clock signal CLK_g stops oscillating. For example, at a representative time t0 in FIG. 4, the frequency indication signal FIND is enabled, representing the oscillating frequency is faster than the target frequency. Inversely, if the frequency indication signal FIND is disabled (dotted line in FIG. 4), the oscillating frequency is slower than the target frequency. According to an alternative embodiment, the frequency indication signal FIND is reversely interpreted, i.e. the enabled frequency indication signal FIND represents the oscillating frequency is slower than the target frequency, and the disabled frequency indication signal FIND represents the oscillating frequency is faster than the target frequency.

Figure 5B:
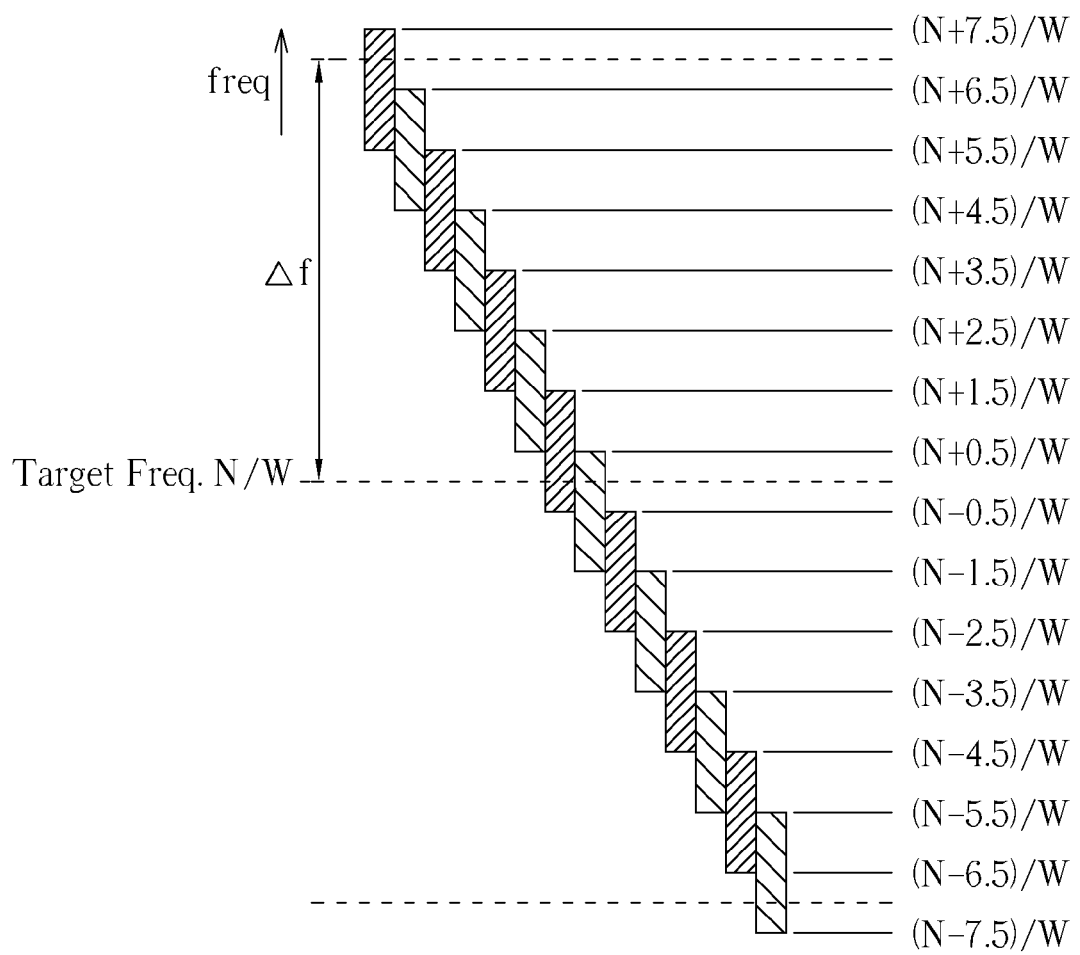
FIG. 5B is a spectrum of frequency bands of a VCO of the PLLs shown in FIG. 1A, FIG. 1B, FIG. 3A and FIG. 3B.

Since the frequency indication signal FIND merely indicates whether the oscillating frequency is greater or less than the target frequency, output digits other than the MSB are further extracted to indicate a calibration margin for the oscillating frequency. For example, please refer to FIG. 5A and FIG. 5B. FIG. 5A is a look-up table of a counting result, output digits and the oscillating frequency of the divider 414 (6-bit). FIG. 5B is a spectrum of frequency bands of the VCO 402. In FIG. 5A and FIG. 5B, W represents a length of the gating window, N represents a desired cycle number within the gating window, and therefore N/W represents the target frequency. In FIG. 5A, the MSB indicates whether the oscillating frequency f is greater than the target frequency N/W, and last three of the six output digits can be exploited to improve the calibration accuracy for the oscillating frequency f. Specifically, logic operations on the last digits generate a frequency-error signal FER indicating whether the VCO frequency is close to the calibration target within $\Delta f$. Accordingly, the VCO 402 determines to step up or step down the oscillating frequency f based on the frequency indication signal FIND as well as the frequency-error signal FER to achieve higher calibration accuracy.

In detail, the control circuit 416 is arranged to perform a binary search on the VCO 402 to adjust the oscillating frequency of the clock signal CLK. As long as the frequency indication signal FIND and the calibration margin $\Delta f$ are determined, the control circuit 416 can accordingly configure the tuning voltage VT corresponding to the target frequency to adjust the oscillating frequency. In addition, the static logic level of the frequency indication signal FIND is derived out of the gating window, e.g. the time t0 in FIG. 2B and FIG. 2A.

Figure 6:
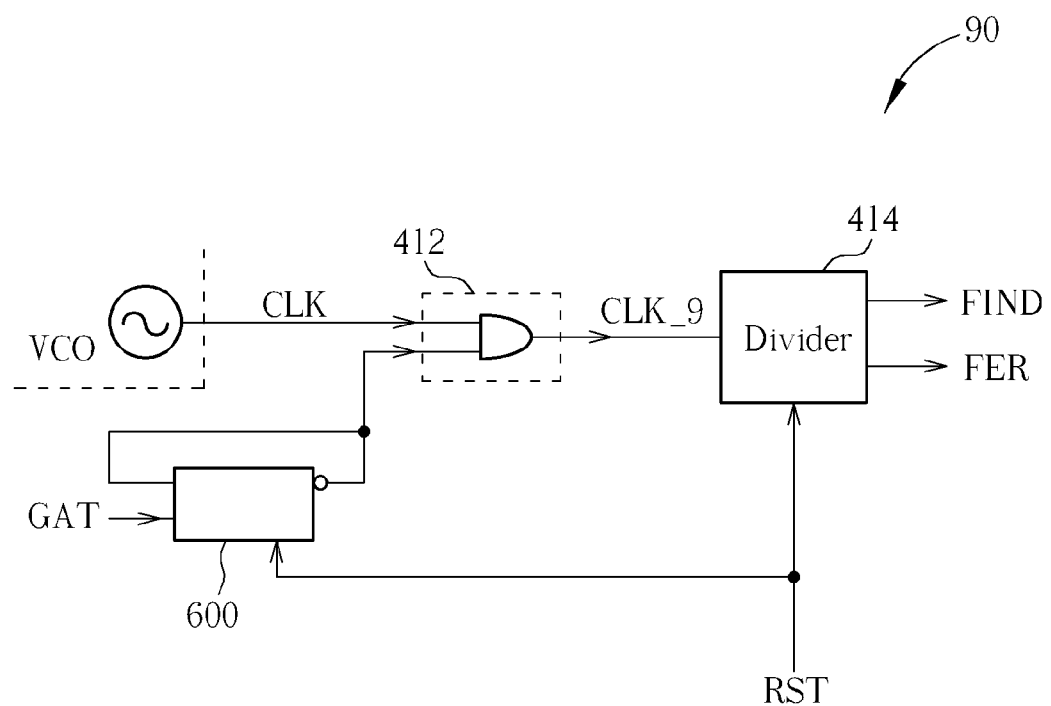
FIG. 6 is a schematic diagram of a frequency calibration device according to an embodiment of the present invention.
Figure 7:
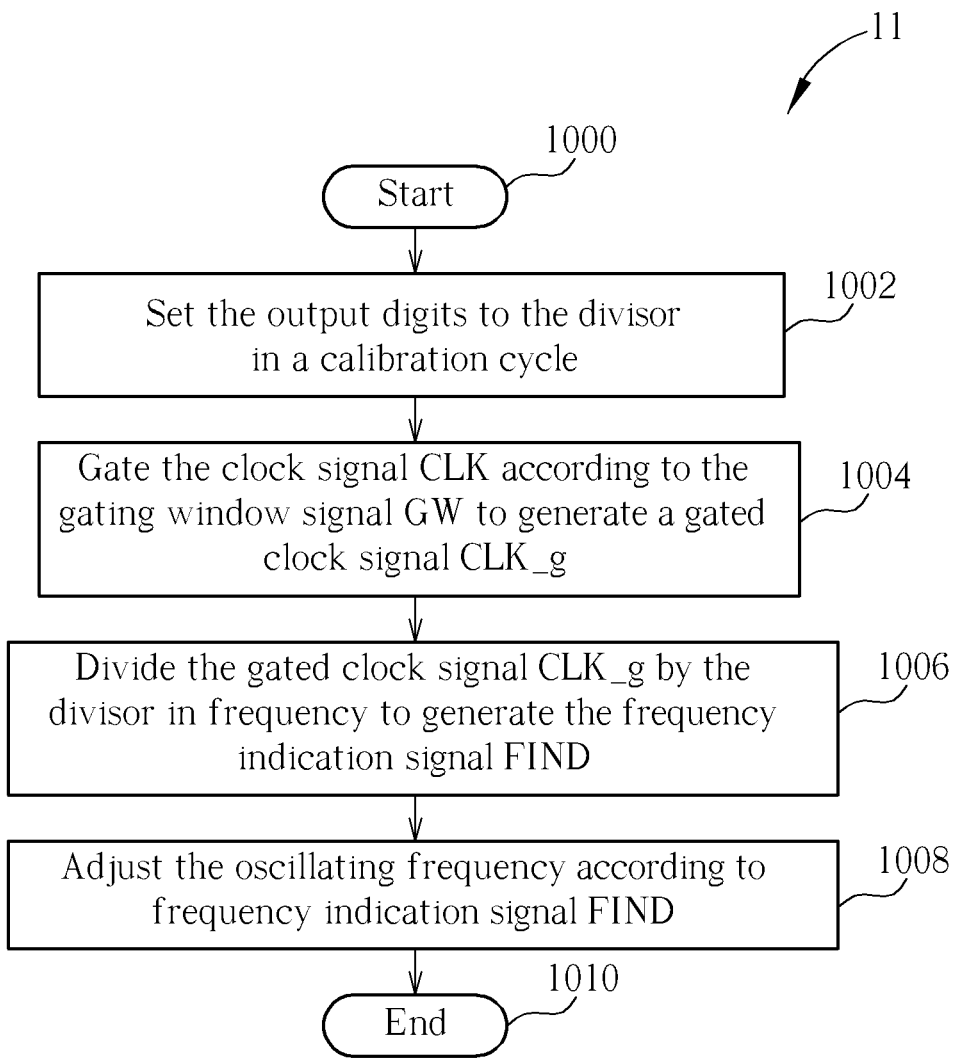
FIG. 7 is a schematic diagram of a frequency calibration process of the frequency calibration device shown in FIG. 6.

The logic unit 412, the divider 414 and the D flip-flop 600 (optional) together function as a calibration device 90, as illustrated in FIG. 6, which can be utilized for calibrating an oscillating frequency of a VCO in electronic devices other than the PLL. Operations of the calibration device 90 can be summarized into a frequency calibration process 11, as illustrated in FIG. 7. The frequency calibration process 11 includes the following steps:

Step 1000: Start.

Step 1002: Set the output digits to the divisor in a calibration cycle.

Step 1004: Gate the clock signal CLK according to the gating window signal GW to generate a gated clock signal CLK_g.

Step 1006: Divide the gated clock signal CLK_g by the divisor in frequency to generate the frequency indication signal FIND.

Step 1008: Adjust the oscillating frequency according to frequency indication signal FIND.

Step 1010: End.

Details of the frequency calibration process 11 are described in the above and not further narrated herein.

Through mode switch, the divider 414 is further utilized for measuring the oscillating frequency of the clock signal CLK. As a result, the VCO 402 can accordingly determine to step up or step down the oscillating frequency and shifts the oscillating frequency with the calibration margin. Since the divider 414 already exists in the feedback loop 410, such a calibration method requires no extra circuit layout area and is advantageous to the manufacturing cost.

To sum up, frequency calibration for the VCO is implemented by the divider existing already to minimize the circuit layout area and the manufacturing cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency calibration device for calibrating an oscillating frequency of a clock signal, the frequency calibration device comprising:
a logic unit, for gating the clock signal according to a gating window signal to generate a gated clock signal, wherein the gating window signal is indicative of a gating window;
a divider, for dividing the gated clock signal by a divisor in frequency to generate a frequency indication signal, wherein a plurality of output digits of the divider are set to the divisor in a calibration cycle;
wherein the frequency indication signal is a most significant bit (MSB) of the plurality of output digits; and
a control circuit, for adjusting the oscillating frequency of the clock signal according to a logic level of the frequency indication signal which is checked after the gated clock signal stops oscillating by the gating window, to determine whether the oscillating frequency is faster or slower than a target frequency.

2. The frequency calibration device of claim 1, further comprising a D flip-flop, comprising an input end, a clock end receiving a gating signal, a reset end receiving a reset signal, for providing the gating window signal according to the reset signal and the gating signal.

3. The frequency calibration device of claim 1, wherein at least one output digit of the divider other than the MSB is utilized for indicating a calibration margin for the oscillating frequency.

4. The frequency calibration device of claim 1, wherein the logic unit is an AND gate for performing AND logic on the clock signal and the gating window signal and accordingly outputting the gated clock signal.

5. A frequency calibration method for calibrating an oscillating frequency of a clock signal, the frequency calibration method comprising:
setting a plurality of output digits of a divider to a divisor in a calibration cycle;
gating the clock signal according to a gating window signal to generate a gated clock signal, wherein the gating window signal is indicative of a gating window;
dividing the gated clock signal by the divisor in frequency to generate a frequency indication signal; and
adjusting the oscillating frequency according to a logic level of the frequency indication signal which is checked after the gated clock signal stops oscillating by the gating window, to determine whether the oscillating frequency is faster or slower than a target frequency;
wherein the frequency indication signal is a most significant bit (MSB) of the plurality of output digits.

6. The frequency calibration method of claim 5 further comprising:
acquiring at least one of the output digits of the divider other than the MSB to indicate a calibration margin for the oscillating frequency.

7. The frequency calibration method of claim 6, wherein the step of adjusting the oscillating frequency according to frequency indication signal comprises determining to step up or step down the oscillating frequency according to the frequency indication signal and shifting the oscillating frequency with the calibration margin.

8. The frequency calibration method of claim 5 further comprising synchronizing the gating window signal with a reset signal.

9. A phase-locked loop (PLL) comprising:
a detector, for generating a tuning voltage according to a frequency reference signal;
a voltage-controlled oscillator (VCO), for generating a clock signal according to the tuning voltage, wherein an oscillating frequency of the clock signal is adjustable; and
a feedback loop, coupled between an output of the VCO and an input of the detector, the feedback loop comprising:
a logic unit, for gating the clock signal to generate a gated clock signal with a gating window;
a divider, for dividing the gated clock signal by a divisor in frequency to generate a frequency indication signal; and
a control circuit, wherein when the tuning voltage is held to fix the oscillating frequency of the clock signal, the control circuit is arranged to adjust the oscillating frequency of the clock signal according to a logic level of the frequency indication signal.

10. The PLL of claim 9, wherein the logic unit is arranged to receive the clock signal and a signal indicative of the gating window.

11. The PLL of claim 9, wherein the divider comprises a plurality of stages corresponding to a plurality of bits representing the divisor, respectively, wherein the plurality of stages are set according to the plurality of bits representing the divisor by a reset signal in a calibration cycle.

12. The PLL of claim 11, wherein the logic unit is arranged to receive the clock signal and a signal indicative of the gating window; and the PLL further comprises a D flip-flop, comprising an input end, a clock end receiving a gating signal, a reset end receiving the reset signal, and an inversion output end coupled to the input end and the logic unit, for providing the signal indicative of the gating window according to the reset signal and the gating signal.

13. The PLL of claim 9, wherein the frequency indication signal is a most significant bit (MSB) of a plurality of output digits from the divider.

14. The PLL of claim 13, wherein at least one of the output digits other than the MSB is utilized for indicating a calibration margin for the oscillating frequency.

15. The PLL of claim 14, wherein the VCO is arranged to determine to step up or step down the oscillating frequency according to the frequency indication signal and shift the oscillating frequency with the calibration margin.

16. The PLL of claim 9, wherein the control circuit is arranged to perform a binary search on the VCO to adjust the oscillating frequency of the clock signal.

17. The PLL of claim 9, wherein the logic level of the frequency indication signal is derived out of the gating window.

18. A device for calibrating an oscillating frequency of a clock signal, comprising:
means for gating the clock signal to generate a gated clock signal with a gating window;
means for dividing the gated clock signal by a divisor in frequency to generate a frequency indication signal; and
means for adjusting the oscillating frequency of the clock signal according to a static logic level of the frequency indication signal.

19. The device of claim 18, wherein the means for gating the clock signal comprises means for receiving the clock signal and a signal indicative of the gating window.

20. The device of claim 18, wherein the means for dividing the gated clock signal utilizes a plurality of stages corresponding to a plurality of bits representing the divisor, respectively, wherein the plurality of stages are set according to the plurality of bits representing the divisor by a reset signal in a calibration cycle.

21. The device of claim 20, wherein the means for gating the clock signal comprises:
   means for receiving the clock signal and a signal indicative of the gating window; and
   means for utilizing a clock end receiving a gating signal, a reset end receiving the reset signal, an input end and an inversion output end coupled to the input end and the logic unit, for providing the signal indicative of the gating window according to the reset signal and the gating signal.

22. The device of claim 18, wherein the frequency indication signal is a most significant bit (MSB) of a plurality of output digits from the means for dividing the gated clock signal.

23. The device of claim 22, wherein at least one output digit other than the MSB is utilized for indicating a calibration margin for the oscillating frequency.

24. The device of claim 18, wherein the clock signal is generated from a voltage-controlled oscillator (VCO), and the means for adjusting the oscillating frequency is arranged to perform a binary search on the VCO to adjust the oscillating frequency of the clock signal.

25. The device of claim 18, wherein the static logic level of the frequency indication signal is derived out of the gating window.

* * * * *